United States Patent
Jiang

(10) Patent No.: US 7,422,913 B2
(45) Date of Patent: Sep. 9, 2008

(54) METHOD FOR CHECKING A CONDITION OF A HEAT TREATMENT

(75) Inventor: Min-Rei Jiang, Kaohsiung (TW)

(73) Assignee: Arima Display Corp., Kaohsiung (TW)

( * ) Notice: Subject to any disclaimer, the term of this patent is extended or adjusted under 35 U.S.C. 154(b) by 915 days.

(21) Appl. No.: 10/852,007

(22) Filed: May 24, 2004

(65) Prior Publication Data

US 2005/0259717 A1      Nov. 24, 2005

(51) Int. Cl.
  *H01L 31/26*   (2006.01)
  *H01L 21/66*   (2006.01)

(52) U.S. Cl. .............. 438/14; 438/10; 438/11; 374/161; 374/162

(58) Field of Classification Search ............ 438/10, 438/11, 14, 17, 18; 374/161, 162
See application file for complete search history.

(56) References Cited

U.S. PATENT DOCUMENTS 5,494,179 A * 2/1996 Hori et al. .............. 216/11
2004/0251527 A1 * 12/2004 Van Puymbroeck et al. . 257/678

* cited by examiner

*Primary Examiner*—Phuc T Dang
(74) *Attorney, Agent, or Firm*—Volpe and Koenig, P.C.

(57) ABSTRACT

A method for connecting terminals is provided. The method includes steps of a) providing a board having a first terminal thereon; b) performing a check of a heat treatment by using a thermal sensitive paper in order to determine a optimal condition of the heat treatment for the board; c) heating the first terminal under the optimal condition of the heat treatment; and d) connecting a second terminal to the heated first terminal.

6 Claims, 3 Drawing Sheets

METHOD FOR CHECKING A CONDITION OF A HEAT TREATMENT

FIELD OF THE INVENTION

This invention mainly relates to a method for connecting terminals, and more particularly to a method for connecting terminals after a step of checking the heat treatment therein by a thermal sensitive material.

BACKGROUND OF THE INVENTION

With the trends of compactness and simplicities, to research and develop smaller and more exquisite products are what various industries strive to. The most conspicuous example is the minimization of the electronics products. Since the sizes of the electronics products are getting decreased, the sizes of the relevant terminals provided thereto are also getting decreased accordingly. However, it would cause the terminals to be very sensitive to the pollutants. For instance, if the terminals are polluted, the relevant bonding strengths and the conductivities thereof would be decreased accordingly. Furthermore, the qualities of the manufactured electronics products would be also decreased accordingly. Therefore, to perform a cleaning step for removing all the pollutants located on the terminals is a determinant for the quality of the manufactured products. Nowadays, it is common to clean the terminal surfaces by a low voltage isoionic technology driven by a radio frequency.

In addition, during the process of assembling the liquid crystal display, since the relevant processes include the steps of etching and washing, it is quite easy for some pollutants, such as water, oil, chemicals, ions or something like being remained on the terminal surfaces. Thus, before the terminals are connected to each other, it is usual to perform a cleaning step for removing the pollutants on the terminal surfaces in order to ensure the qualities of the relevant manufactured products. At present, the common methods used for cleaning the terminal surfaces include to remove the ions by the electromagnetic radiation, to remove the dust or other solid pollutants by an air compressor, and to vaporize the water or other chemicals via a thermal flame treatment. In which, it should be noted that since the properties of different parts of the terminal surfaces are different from each other, the temperature of the introduced thermal flame should be adjusted accordingly. However, during the process of the traditional thermal flame treatment, since the whole terminal surfaces are treated with the same thermal flame treatment, the bonding strengths and the conductivities of the terminals are often affected.

In addition, an operator usually adjusts the temperature of the thermal flame according to the readings of the meters on the cylinders, that is to say he adjusts the temperature by controlling the mixtures of the fuel gas, the combustion-supporting, and the air. However, since the readings of the conventional meters on the cylinders are generally determined by the pressures of the gases in the cylinders and the sensitiveness relevant to the fine pressure of the meters is not so exquisite, an operator can not be aware of the fine pressure changes and the related temperature changes of the thermal flame. In other words, how to effectively and immediately monitor the fine temperature changes of the thermal flame in order to adjust the supplying of different gases is still an unsolved problem.

In view of the foresaid discussions, a new method having a checking step of determining the condition of the heat treatment and monitoring the fine condition changes for increasing the bonding strength and the conductivities for connecting terminals is expected.

SUMMARY OF THE INVENTION

In one respect of the present invention, a method for checking a condition of a heat treatment is provided. The method includes steps of: a) providing a substrate having a connecting surface; b) forming a removable thermal sensitive layer on the connecting surface; c) obtaining a checked result by heating the removable thermal sensitive layer under the condition of the heat treatment; and d) judging the condition of the heat treatment by comparing the checked result with a predetermined value.

Preferably, the substrate includes an indium tin oxide (ITO) circuit.

Preferably, the substrate is a board used in a liquid crystal display module.

Preferably, the substrate is a board connected to an integrated circuit.

Preferably, the thermal sensitive layer has a color and a temperature, in which the color varies in response to a variation of the temperature.

Preferably, the thermal sensitive layer is a thermal sensitive paper.

In another aspect of the present invention, a method for processing a terminal is provided. The method includes steps of: a) providing a board having a plurality of connecting areas thereon; b) forming a plurality of removable checking layers on the plurality of connecting areas; c) processing a first one of the plurality of checking layers with a first heat treatment to obtain a first checked result; d) adjusting the first heat treatment if the first checked result fails to meet with a first predetermined value and then reprocessing the first checking layer with an adjusted first heat treatment; e) repeating the step d) until the first checked result meets with the first predetermined value, thereby obtaining a first optimal heat treatment; f) repeating the steps c) to e) to obtain a plurality of f) optimal heat treatments for the plurality of connecting areas respectively; and g) processing the plurality of connecting areas with the plurality of optimal heat treatments respectively.

Preferably, the board includes an indium tin oxide (ITO) circuit.

Preferably, the board is used in a liquid crystal display module.

Preferably, the board is connected to an integrated circuit.

Preferably, the method further includes a step h) removing the plurality of removable checking layers.

Preferably, the plurality of removable checking layer are made of a thermal sensitive material.

Preferably, the thermal sensitive material has a color and a temperature, in which the color varies in response to a variation of the temperature.

Preferably, the thermal sensitive material is a paper.

In accordance to another respect of the present invention, a method for connecting terminals is provided. The method includes steps of a) providing a board having a first terminal thereon; b) performing a check of a heat treatment by using a thermal sensitive paper in order to determine a condition of the heat treatment for the board; c) heating the first terminal under the condition of the heat treatment; and d) connecting a second terminal to the heated first terminal.

Preferably, the board includes an indium tin oxide (ITO) circuit.

Preferably, the board is used in a liquid crystal display module.

Preferably, the board is connected to an integrated circuit.

Preferably, the thermal sensitive paper formed on the board is removable.

Preferably, the step c) further includes a step c1) removing the thermal sensitive paper.

The above contents and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1B:
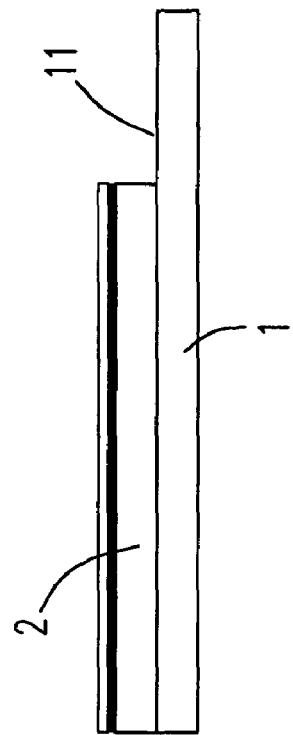
FIGS. 1(A)-(B) are the top view and the side view of the liquid crystal display module according to the prior art.
Figure 1A:
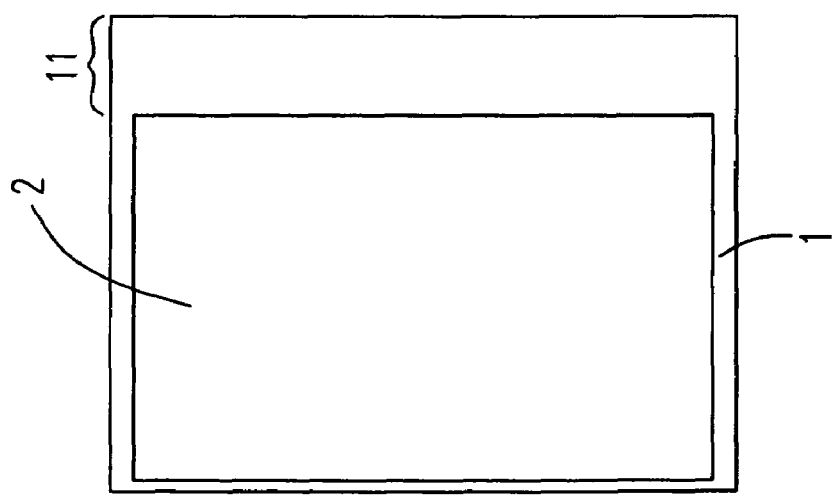

Please refer to FIGS. 1(A)-(B), which are respective the top view and side view of the LCD module according to the prior art. As shown in FIGS. 1(A)-(B), the LCD panel 2 is connected to the terminal board 1, and the terminal board 1 has a connecting area 11 for being connected with other devices.

Figure 2:
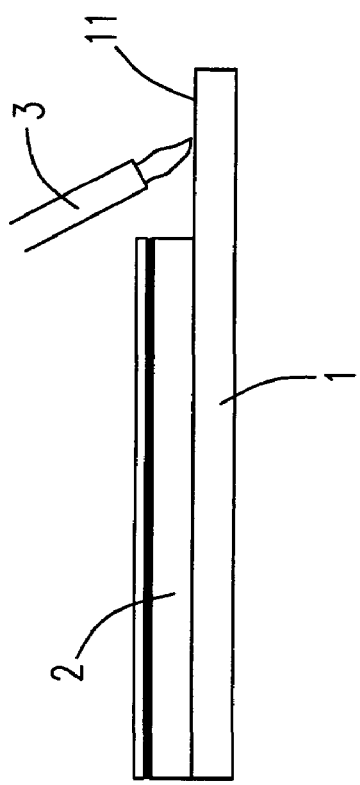
FIG. 2 is a diagram showing the cleaning of the terminal surfaces by a thermal flame according to the prior art.

Please refer to FIG. 2, which is the schematic diagram showing the cleaning of the connecting area 11 by a thermal flame 3 according to the prior art. As shown in FIG. 2, in the prior art, the whole connecting area 11 is treated with the same thermal flame 3. Accordingly, the treatments with different thermal temperature specific for certain individual connecting zones are ignored.

Figure 3:
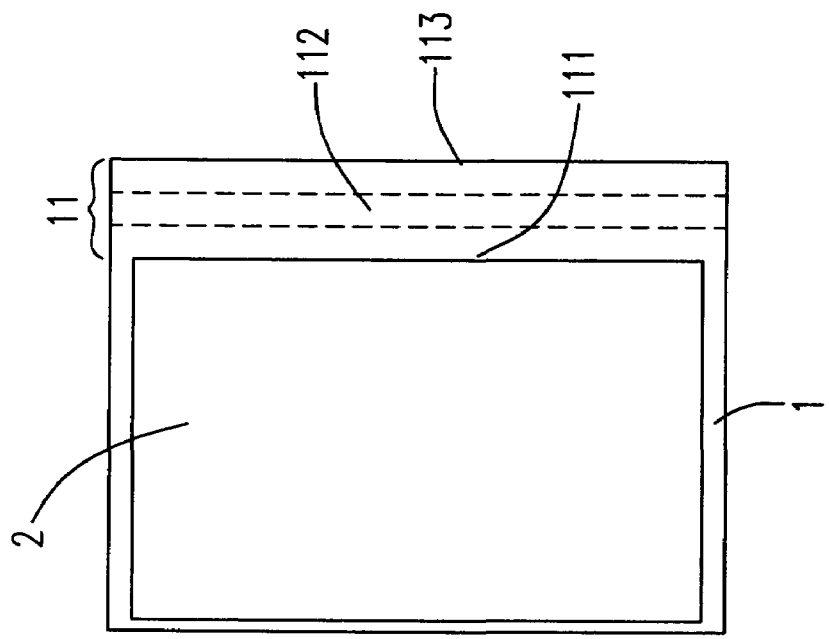
FIG. 3 shows different connecting zones of the connecting area on the terminal board according to a preferred embodiment of the present invention.

Please refer to FIG. 3, which is the schematic diagram showing the different connecting zones of the connecting area according to a preferred embodiment of the present invention. Since the different zones of the connecting area 11 would be connected with different terminals of other instruments (not shown), the optimal processing conditions of the heat treatments for the different zones are not the same. In other words, to find out the optimal conditions of the heat treatments for different zones and apply the individual optimal heat treatments to heat the different zones of the connecting areas 11 are advantageous for increasing the cleaning efficiency. It should be noted that the above optimal condition of the heat treatment is the condition that the yield rate of the manufactured products is 99% or more. In simplification, the connecting area 11 is simply divided into three zones, the inner zone 111, the transitional zone 112 and the outer zone 113.

In general, during the heat treatment, since the terminal board 1 is located on a moving platform (not shown), the duration of the heat treatment for each terminal board 1 is determined by the moving rate of the moving platform, i.e. the lower the moving rate is the longer the duration of the heat treatment is. Therefore, while finding out the optimal conditions for heat treatments, the moving rate of the moving platform should be considered.

Please refer to Table 1, which shows the optimal conditions of the heat treatments for the inner zone 111, the transitional zone 112, and the outer zone 113. In which, the fuel gas supplying and the oxygen gas supplying (as the combustion-supporting) are constant, such as both pressures are 0.25 kg/cm$^2$.

TABLE 1

The optimal conditions of the heat treatments for different zones of the connecting area of the terminal board.

| Moving rate of the moving platform | Slow down by 25% | Slow down by 30% | Slow down by 35% |
| --- | --- | --- | --- |
| Outer zone 113 | 342° C. | 303° C. | 270° C. |
| Transitional zone 112 | 186° C. | 132° C. | 98° C. |
| Inner zone 111 | 100° C. | 83° C. | 65° C. |

As shown in Table 1, the temperatures of the optimal conditions of the heat treatment for the inner zone 111, the transitional zone 112 and the outer zone 113 all decrease in response to the decreased moving rates of the moving platform. In other words, when the moving rates of the moving platform is lowered down, the temperatures of the heat treatments could be decreased. That is to say the invention provides a possibility of saving fuel cost.

In general, under the same supplies of the fuel gas and the combustion-supporting, although, an experienced operator could adjust the conditions of the heat treatments for the inner zone 111, the transitional zone 112 and the outer zone 113 by applying different the thermal flames, such as the outer flame, the inner flame, and the core. However, it is not a quite practical method to adjust the conditions of the heat treatments merely by the experiences. Thus, for solving the drawback of roughly adjusting the temperatures of the heat treatments, a method for checking the temperatures of the heat treatments via a thermal sensitive material is provided.

Figure 4C:
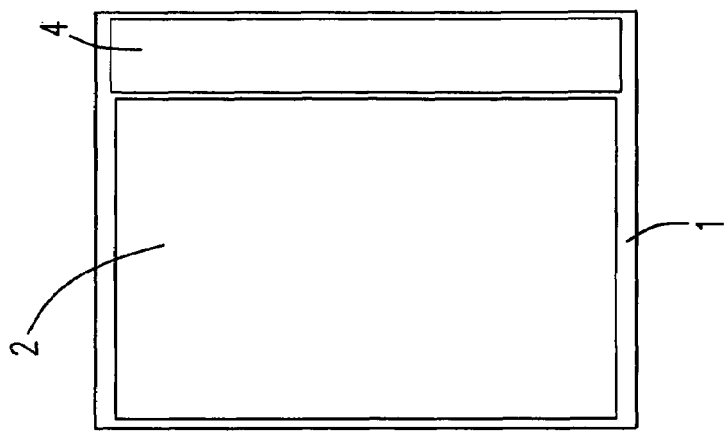
FIGS. 4(A)-(C) show the schematic diagrams of the connecting processes of the terminal boards according to a preferred embodiment of the present invention.
Figure 4B:
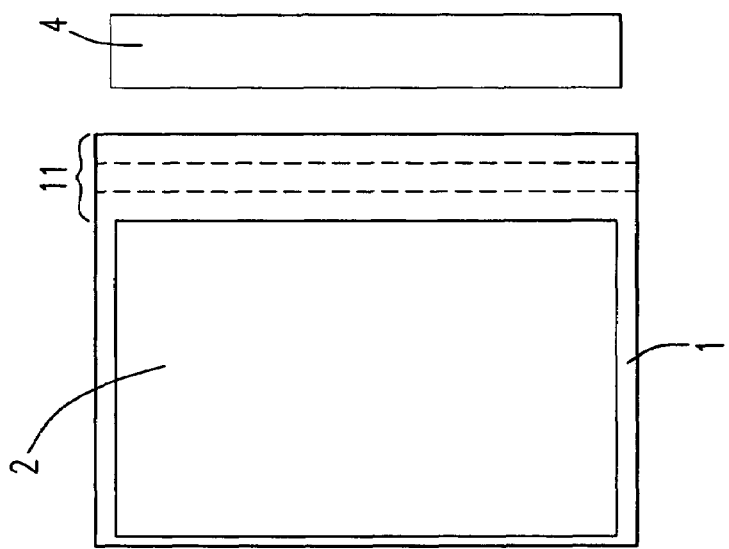
Figure 4A:
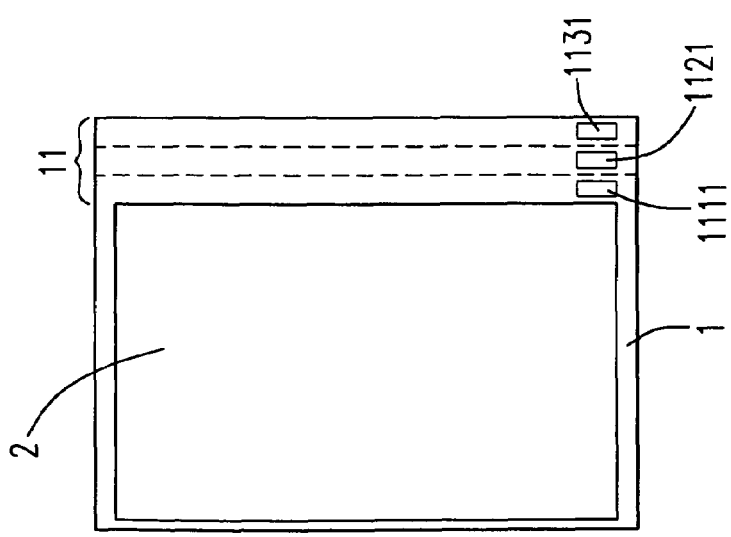

Please refer to FIGS. 4(A)-(C), which are the diagrams showing the connecting processes of the terminal boards according to a preferred embodiment of the present invention. As shown in FIG. 4 (A), firstly, three thermal sensitive materials 1111, 1121, and 1131 are respectively formed onto the inner zone 111, the transitional zone 112, and the outer zone 113. Secondly, the three thermal sensitive materials 1111, 1121, and 1131 are processed under different heat treatments and then the checked results are compared with the individual predetermined values. If the checked results fail to meet with the predetermined values, the conditions of the heat treatments will be adjusted, such as the supplies of the fuel gas or the combustion-supporting. Then, the adjusted thermal sensitive materials 1111, 1121, and 1131 are processed. The above processes are repeated until all the checked results meet the standard of the predetermined values and thereby the optimal conditions for the individual heat treatments are obtained.

Preferably, the thermal sensitive materials are the material with a color and a temperature indicator, and the color varies in response to a variety of the temperature. Therefore, the operator can easily determine the temperatures of the heat treatments by the color changes, and it is really more convenient and precise when compared with the conventional method of judging the temperature simply by one's experience. The common introduced thermal sensitive materials include the insulating tape, the paper tape, the plastic piece, the thermal sensitive paper, the toilet paper, the facial tissues and so on. In fact, any material having regular responses to heat might be used as the thermal sensitive material. Our pretests show that the thermal sensitive paper is the most suitable thermal sensitive material in our embodiments.

Furthermore, it should be noted that the relationships between the color changes and the temperature changes for the thermal sensitive papers had been prepared into a catalogue (not shown) for usage. In addition, since the thermal sensitive materials (actually, they are thermal sensitive papers in this embodiment) 1111, 1121, and 1131 are respectively adhered onto the inner zone 111, traditional zone 112, and the outer zone 113, it would be more proper to adhere the thermal sensitive materials 1111, 1121, and 1131 onto the positions where has no circuits arranged thereon, for example the edges of different zones 111, 112, and 113, in order to reduce the unnecessary pollutants remained on the zones 111, 112, and 113 after the thermal sensitive materials 1111, 1121, and 1131 are removed.

In addition, one reason of why the thermometer is not suitable in the present embodiments is that the relevant manufacturing processes is performed under the room temperature. Therefore, once the thermometer is removed from the thermal flame, it cools down rapidly. Contrarily, when the thermometer under the room temperature is directly processed by the thermal flame, its temperature would increase rapidly. However, a longer duration for stabilizing the temperature of the thermometer would be needed. In addition, since the repeated vast temperature changes are not good for the thermometers, the thermometers might be damaged and the cost of the manufacturing processes will be increased accordingly.

As to the concepts of the present invention, sine it is the articles for daily use are implemented, such as the thermal sensitive papers as the thermo energy indicators, it's quite convenient and cost-saving. In addition, since one operator can determine the heat treatments according to the color changes of the thermal sensitive materials, it is more reliable compared with judging merely by experiences. Furthermore, since the thermal sensitive materials of the embodiment are detachable from the zones 111, 112, and 113, the checked thermal sensitive materials can be collected and compiled into lists as the quality control reports of the manufactured products. Moreover, since the checked thermal sensitive materials are the substantial, one report with which is more convincible than one that just written by a pen and has no objects therewith.

After finding out the optimal conditions for the individual heat treatments, the checked thermal sensitive materials 1111, 1121, and 1131 are removed, such as shown in FIG. 4(B). It should be noted that the thermal sensitive materials 1111, 1121, and 1131 might not be removed if they do not have influences in the following connecting processes. After heating the inner zone 111, the traditional zone 112, and the outer zone 113 under their individual optimal conditions of the heat treatments, the integrated circuit board 4 is connected to the heated terminal board 1, as shown in FIG. 4(C).

As the above-mentioned descriptions, one advantage of the method according to the present invention is to improve the cleaning efficiency of the heat treatments for connecting terminals. Another advantage of the method according to the present invention is to provide a concept of using a daily use article, such as the thermal sensitive material, to determine whether the introduced heat treatments are the optimal or not. Therefore, the method provided in the present invention not only easily provides the products that meet the trends of the compactness and simplicities, but also decreases the relevant cost, controls the relevant pollutants and increases the bonding strings and conductivities. To sum up, the method provided in the present invention does have the novelty, the progressiveness, and utility in the industry.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for checking a condition of a heat treatment, comprising steps of:
    a) providing a substrate having a connecting surface;
    b) forming a removable thermal sensitive layer on said connecting surface;
    c) obtaining a checked result by heating said removable thermal sensitive layer under said condition of said heat treatment; and
    d) judging said condition of said heat treatment by comparing said checked result with a predetermined value.

2. The method as claimed in claim 1, wherein said substrate comprises an indium tin oxide (ITO) circuit.

3. The method as claimed in claim 1, wherein said substrate is a board used in a liquid crystal display module.

4. The method as claimed in claim 1, wherein said substrate is a board connected to an integrated circuit.

5. The method as claimed in claim 1, wherein said thermal sensitive layer has a color and a temperature, in which said color varies in response to a variation of said temperature.

6. The method as claimed in claim 1, wherein said thermal sensitive layer is a thermal sensitive paper.

* * * * *